United States Patent
Ramaswamy et al.

(10) Patent No.: US 10,636,471 B2
(45) Date of Patent: Apr. 28, 2020

(54) MEMORY ARRAYS, FERROELECTRIC TRANSISTORS, AND METHODS OF READING AND WRITING RELATIVE TO MEMORY CELLS OF MEMORY ARRAYS

(71) Applicant: Micron Technology, Inc., Boise, ID (US)

(72) Inventors: Durai Vishak Nirmal Ramaswamy, Boise, ID (US); Wayne Kinney, Emmett, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/134,221

(22) Filed: Apr. 20, 2016

(65) Prior Publication Data

US 2017/0309322 A1    Oct. 26, 2017

(51) Int. Cl.
*G11C 11/22* (2006.01)
*H01L 27/1159* (2017.01)
(Continued)

(52) U.S. Cl.
CPC ........ *G11C 11/2275* (2013.01); *G11C 11/223* (2013.01); *G11C 11/2273* (2013.01); *H01L 27/1159* (2013.01); *H01L 27/11507* (2013.01); *H01L 29/40111* (2019.08); *H01L 29/7881* (2013.01); *H01L 29/78391* (2014.09); *G11C 11/2257* (2013.01)

(58) Field of Classification Search
CPC ..... G11C 11/22; G11C 11/21; G11C 11/2255; G11C 11/2257
USPC .......................................... 365/145, 65, 117
See application file for complete search history.

(56) References Cited

U.S. PATENT DOCUMENTS 6,337,805 B1   1/2002 Forbes et al.
2001/0018221 A1*  8/2001 Takasu ............. H01L 21/28291
                                                              438/3
(Continued)

FOREIGN PATENT DOCUMENTS

TW          106113156          4/2018

OTHER PUBLICATIONS

Arimoto et al., "Current Status of Ferroelectric Random-Access Memory", MRS Bulletin, Nov. 2004, pp. 823-828.
(Continued)

*Primary Examiner* — Alfredo Bermudez Lozada
(74) *Attorney, Agent, or Firm* — Wells St. John P.S.

(57) ABSTRACT

Some embodiments include a ferroelectric transistor. The transistor has gate dielectric material configured as a first container, with the first container having a first inner surface. Metal-containing material is configured as a second container nested within said first container. The second container has a second inner surface with an area less than the first inner surface. Ferroelectric material is configured as a third container nested within the second container. The third container has a third inner surface with an area less than the second inner surface. Gate material is within the third container. Some embodiments include memory arrays having ferroelectric transistors as memory cells. Some embodiments include methods of writing/reading relative to memory cells of memory arrays when the memory cells are metal-ferroelectric-metal-insulator-semiconductor (MFMIS) transistors.

18 Claims, 8 Drawing Sheets

(51) Int. Cl.
*H01L 21/28* (2006.01)
*H01L 29/78* (2006.01)
*H01L 27/11507* (2017.01)
*H01L 29/788* (2006.01)

(56) References Cited

U.S. PATENT DOCUMENTS

| | | | |
|---|---|---|---|
| 2002/0038402 A1* | 3/2002 | Kanaya | H01L 21/28273 |
| | | | 711/1 |
| 2003/0086285 A1 | 5/2003 | Yamaguchi | |
| 2003/0235067 A1* | 12/2003 | Sakai | G11C 11/22 |
| | | | 365/145 |
| 2006/0160251 A1* | 7/2006 | Dyreklev | G11C 11/22 |
| | | | 438/3 |
| 2008/0203443 A1 | 8/2008 | Wilson et al. | |
| 2016/0005749 A1 | 1/2016 | Li et al. | |
| 2016/0071947 A1 | 3/2016 | Wiatr et al. | |

OTHER PUBLICATIONS

Tokumitsu et al., "Nonvolatile ferroelectric-gate field-effect transistors using SrBi2TaO9/Pt/SrTa2O6/SiON/Si structures", Applied Physics Letters, vol. 75 (4), Jul. 26, 1999, pp. 575-577.
WO PCT/US2017/027987 Search Rept., dated Aug. 28, 2017, Micron Technology, Inc.
WO PCT/US2017/027987 Writ. Opin., dated Aug. 28, 2017, Micron Technology, Inc.
WO PCT/US2017/027987 IPRP, dated Oct. 23, 2018, Micron Technology, Inc.

* cited by examiner

MEMORY ARRAYS, FERROELECTRIC TRANSISTORS, AND METHODS OF READING AND WRITING RELATIVE TO MEMORY CELLS OF MEMORY ARRAYS

TECHNICAL FIELD

Memory arrays, ferroelectric transistors, and methods of reading and writing relative to memory cells of memory arrays.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Ferroelectric field effect transistors (FeFET) may be utilized as memory cells. Specifically, the FeFETs may have two selectable memory states corresponding to two different polarization modes of ferroelectric material within the FeFETS FeFETs. The different polarization modes may be characterized by, for example, different threshold voltages (Vt) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between metal (M) and a semiconductor substrate (S). Such also has ferroelectric (F) material over the metal, and has a gate (typically comprising metal, M) over the ferroelectric material. In operation, an electric field across the ferroelectric material is to be used to switch the ferroelectric material from one polarization mode to another. However, it is problematically found that the gate insulator breaks down when a sufficiently high electric field is provided across the ferroelectric material to change the polarization mode.

It would be desirable to develop new ferroelectric transistors which address the above-discussed problem, and new memory array architectures utilizing such transistors. It would also be desirable to develop read/write methodologies suitable for the new memory arrays, and possibly suitable for other memory arrays.

DETAILED DESCRIPTION OF THE ILLUSTRATED EMBODIMENTS

Metal-ferroelectric-metal-insulator-semiconductor (MFMIS) transistors may be utilized as memory cells. Programming of the memory cells comprises formation of an electric field across ferroelectric material of the MFMIS transistor. However, the electric field is also simultaneously provided across the gate dielectric. A problem encountered during programming of such memory cells is that the electric field across gate dielectric of the MFMIS transistor is much higher than the electric field across the ferroelectric material due to the gate dielectric having a lower dielectric constant (k) than the ferroelectric material. In many cases, the electric field across the gate dielectric may exceed the breakdown voltage of the gate dielectric before sufficient electric field is provided across the ferroelectric material to program the memory cell (i.e., sufficient electric field to achieve saturation polarization within the ferroelectric material). A possible solution to such problem is to reduce the area of ferroelectric material subjected to the electric field relative to the area of gate dielectric subjected to the electric field. Specifically, the MFMIS transistor may be considered to comprise a ferroelectric capacitor (the MFM portion) connected in series to a dielectric capacitor comprising gate dielectric as capacitive material (the MIS portion). One way to balance the electric field across both capacitors is to reduce the area of the ferroelectric capacitor as compared to the dielectric capacitor.

Some embodiments include new MFMIS transistor constructions in which the various materials of MFMIS transistors are configured as nested container shapes. Such configurations have the ferroelectric capacitor regions of the MFMIS with reduced area as compared to the dielectric capacitor regions. Some embodiments include memory arrays comprising the new MFMIS transistor constructions. Some embodiments include methods for reading/writing relative to memory arrays comprising MFMIS transistors.

Example embodiments are described below with reference to FIGS. 1-8.

Figure 1:
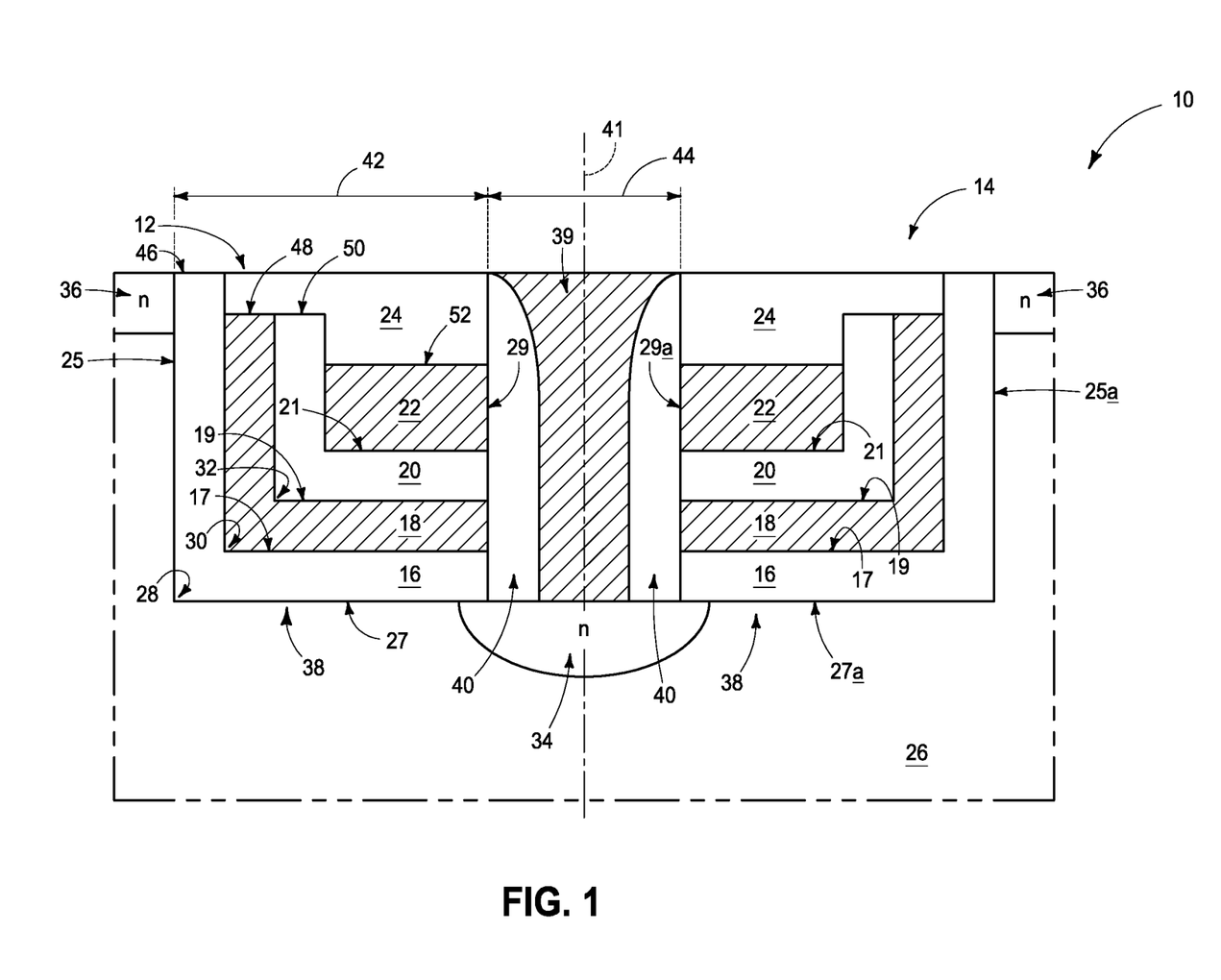
FIG. 1 is a diagrammatic cross-sectional view of a construction comprising a pair of example ferroelectric transistors.

Referring to FIG. 1, a portion of a memory array 10 is illustrated. The illustrated portion comprises a pair of ferroelectric transistors (specifically, MFMIS transistors) 12 and 14; which may be referred to as first and second ferroelectric transistors, respectively. The memory array 10 comprises a plurality of ferroelectric transistors in row/column arrangement (as described below with reference to FIG. 3), and the ferroelectric transistors 12 and 14 are adjacent to one another along a column of the array.

Each of the ferroelectric transistors 12 and 14 comprises gate dielectric material 16, metal-containing material 18, ferroelectric material 20, and gate material 22. The gate dielectric material 16 is configured as a first container having a first inner surface 17, the metal-containing material is configured as a second container nested within the first container and having a second inner surface 19, and the ferroelectric material is configured as a third container nested within the second container and having a third inner surface 21. The nested configuration of materials 16, 18 and 20 leads to the third inner surface 21 having a smaller area than the second inner surface 19, which in turn has a smaller area than the first inner surface 17.

The gate dielectric material 16 may comprise any suitable composition or combination of compositions including, for example, silicon dioxide, aluminum oxide, hafnium oxide, zirconium oxide, etc. Although the gate dielectric material is illustrated to comprise a single homogeneous material, in other embodiments the gate dielectric material may comprise two or more discrete separate materials.

The metal-containing material 18 may be referred to as a floating gate of the MFMIS transistor, and may comprise any suitable composition or combination of compositions. For instance, the metal-containing material may comprise elemental metal (for instance, titanium, tungsten, ruthenium, etc.), metal-containing alloys or other compositions (for instance, metal nitride, metal carbide, metal silicide, etc.). In some embodiments, metal-containing material 18 may comprise, consist essentially of, or consist of titanium nitride. Although the metal-containing material is illustrated to comprise a single homogeneous material, in other embodiments the metal-containing material may comprise two or more discrete separate materials.

Ferroelectric material 20 may comprise any suitable composition or combination of compositions; and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. Although the ferroelectric material is illustrated to comprise a single homogeneous material, in other embodiments the ferroelectric material may comprise two or more discrete separate materials.

The gate material 22 may comprise any suitable composition or combination of compositions. For instance, the gate material may comprise elemental metal (for instance, titanium, tungsten, ruthenium, etc.), metal-containing alloys or other compositions (for instance, metal nitride, metal carbide, metal silicide, etc.). In some embodiments, gate material 22 may comprise, consist essentially of, or consist of one or more of titanium nitride, tungsten, ruthenium and ruthenium silicide. Although the gate material is illustrated to comprise a single homogeneous material, in other embodiments the gate material may comprise two or more discrete separate materials.

The ferroelectric transistors 12 and 14 are capped by an insulative material 24. Such insulative material may comprise any suitable composition or combination of compositions; and in some embodiments may comprise, consist essentially of, or consist of silicon nitride. Although the insulative material 24 is shown to comprise a single homogeneous material, in other embodiments such insulative material may comprise two or more separate materials.

The ferroelectric transistors 12 and 14 are supported by a substrate 26. The substrate 26 may comprise semiconductor material; and may, for example, comprise, consist essentially of, or consist of monocrystalline silicon. The substrate 26 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the substrate 26 may correspond to a semiconductor substrate containing one or more materials associated with integrated circuit fabrication. Such materials may include, for example, one or more of refractory metal materials, barrier materials, diffusion materials, insulator materials, etc.; and may be, for example, below and/or laterally offset from the illustrated region of the substrate. In the shown embodiment, substrate 26 comprises p-type doped semiconductor material; such as, for example, p-type doped monocrystalline silicon.

In the illustrated embodiment, the first, second and third containers formed of materials 16, 18 and 20 are elbow-shaped. The outermost first container (the container of dielectric material 16) has two sides 25 and 27 joining to one another at a corner 28. Such corner has an angle of about 90°. In other embodiments, other elbow-shaped configurations may be utilized which have corners 28 with angles other than 90°.

The second and third containers corresponding to materials 18 and 20, respectively, have corners 30 and 32 analogous to the corner 28, and of similar angle as the corner 28.

The outer sides 25 and 27 of the first container (the container of dielectric material 16) may be referred to as a first side and a second side, respectively. Such first and second sides define about half of a four-sided structure in the illustrated embodiment. Specifically, the sides 25 and 27 define about half of a rectangular-shaped structure in the illustrated embodiment.

The sides 25 and 27 are labeled for the first ferroelectric transistor 12. The second ferroelectric transistor 14 has analogous sides 25a and 27a.

A first source/drain region 34 is along the second sides 27 and 27a of the first and second ferroelectric transistors 12 and 14, and shared by the ferroelectric transistors 12 and 14.

Second source/drain regions 36 are along the first sides 25 and 25a of the first and second ferroelectric transistors 12 and 14. The first source/drain region 34 is laterally between the second source/drain regions 36.

In the illustrated embodiment, the first source/drain region 34 is beneath ferroelectric transistors 12 and 14 and electrically connected to an electrical contact 39. Each of the illustrated four-sided ferroelectric transistors 12 and 14 may be considered to comprise a third side (29 of ferroelectric transistor 12, and 29a of ferroelectric transistor 14); with the third side extending along edges of the insulative material 24, gate material 22, ferroelectric material 20, metal-containing material 18 and gate dielectric material 16. The third side 29/29a is directly against the second side 27/27a of the four-sided structures.

The adjacent ferroelectric transistors 12 and 14 may be considered to face one another along the respective third sides 29 and 29a and to be substantially mirror images of one another across a plane 41 extending vertically through a center of interconnect 39. The term "substantially mirror images" means that the adjacent ferroelectric transistors are mirror images of one another to within reasonable tolerances of fabrication and measurement.

The interconnect 39 may be referred to as an intervening contact which spaces ferroelectric transistors 12 and 14 from one another. The conductive material of interconnect 39 is spaced from conductive materials 18 and 22 of the ferroelectric transistors 12/14 by insulative spacers 40.

The spacers 40 may comprise any suitable insulative composition or combination of compositions; including, for example, silicon nitride, silicon dioxide, silicon oxynitride, etc. In the shown embodiment, the insulative spacers 40 extend entirely along the third sides 29/29a of ferroelectric transistors 12 and 14. In other embodiments, other configurations of insulative spacers may be utilized, such as, for example, spacers localized to the edges of conductive materials 18 and 22.

The conductive contact 39 may comprise any suitable conductive composition or combination of compositions; and in some embodiments may comprise, consist essentially of, or consist of one or more metals (for instance, copper), metal-containing compositions (for instance, metal nitrides, metal silicides, alloys of two or more metals, etc.) and/or conductively-doped semiconductor materials (for instance, conductively-doped silicon, conductively-doped germanium, etc.).

Channel regions 38 are within substrate 26 along outer surfaces of the gate dielectric material 16 between the first and second source/drain regions 34/36 of the first and second ferroelectric transistors 12/14. Although the illustrated embodiment comprises p-type channel regions extending between n-type doped source/drain regions, in other embodiments the relative doping of the channel regions and the source/drain regions may be reversed so that the channel regions are n-type and the source/drain regions are p-type.

The ferroelectric transistors 12/14 may comprise any suitable dimensions, and in some embodiments may have a width 42 along the illustrated cross-section within a range of from about 200 Å to about 500 Å. The adjacent ferroelectric transistors 12 and 14 may be spaced from one another by any suitable distance 44, and in some embodiments such distance may be within a range of from about 150 Å to about 250 Å.

In the shown embodiment, the first container (the container of dielectric material 16) has an upper edge 46, and the second and third containers (the containers of metal-containing material 18 and ferroelectric material 20) have upper edges 48 and 50, respectively which are inset relative to upper edge 46. Additionally, the gate 22 has an upper edge 52 which is inset relative to edges 48 and 50.

Figure 2:
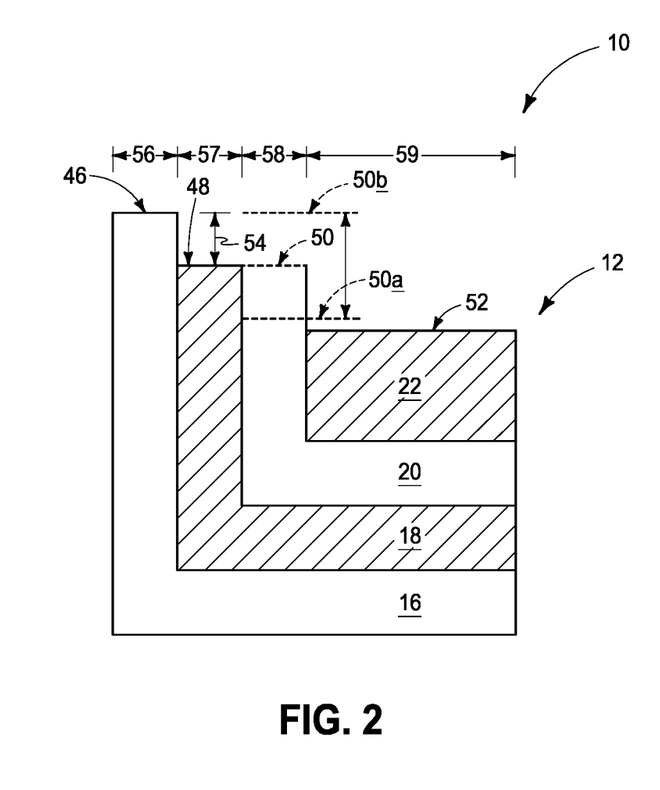
FIG. 2 is a diagrammatic cross-sectional view of regions of an example ferroelectric transistor.

Example dimensions for the various insets are described with reference to a region of ferroelectric transistor 12 shown in FIG. 2. Specifically, FIG. 2 shows the edge 48 of metal-containing material 18 inset relative to the edge 46 of dielectric material 16 by a distance 54. Such distance may be greater than 50 nm in some embodiments. The upper edge 50 of ferroelectric material 20 may be inset relative to edge 46 of gate dielectric 16 by about a same amount as the upper edge 48 of metal-containing material 18, as shown by a dashed line labeled 50. The term "about a same amount" means that the amount is the same to within reasonable tolerances of fabrication and measurement. In some embodiments the upper edge of ferroelectric material 20 may be inset by a lesser amount than the upper edge of material 18 as shown by a dashed-line labeled 50b, and in some embodiments may be inset by a greater amount than the upper edge of material 18 as shown by a dashed line labeled 50a. Generally, the upper edge of ferroelectric material 20 will be no higher than the upper edge 46 of the gate dielectric material 16, and no lower than the upper edge 52 of gate 22.

Thicknesses of materials 16, 18 and 20 are labeled in FIG. 2 as 56-58, respectively. An example thickness of the gate dielectric material 16 is within a range of from about 10 Å to about 50 Å; an example thickness of metal-containing material 18 is within a range of from about 10 Å to about 50 Å; and an example thickness of ferroelectric material 20 is within a range of from about 10 Å to about 50 Å.

A lateral dimension of the gate material 22 is labeled in FIG. 2 as 59. Such lateral dimension may be within a range of from about 100 Å to about 200 Å in some example embodiments.

Wordlines and digit lines extend along rows and columns, respectively, of memory array 10. Such are illustrated in FIG. 3.

Figure 3:
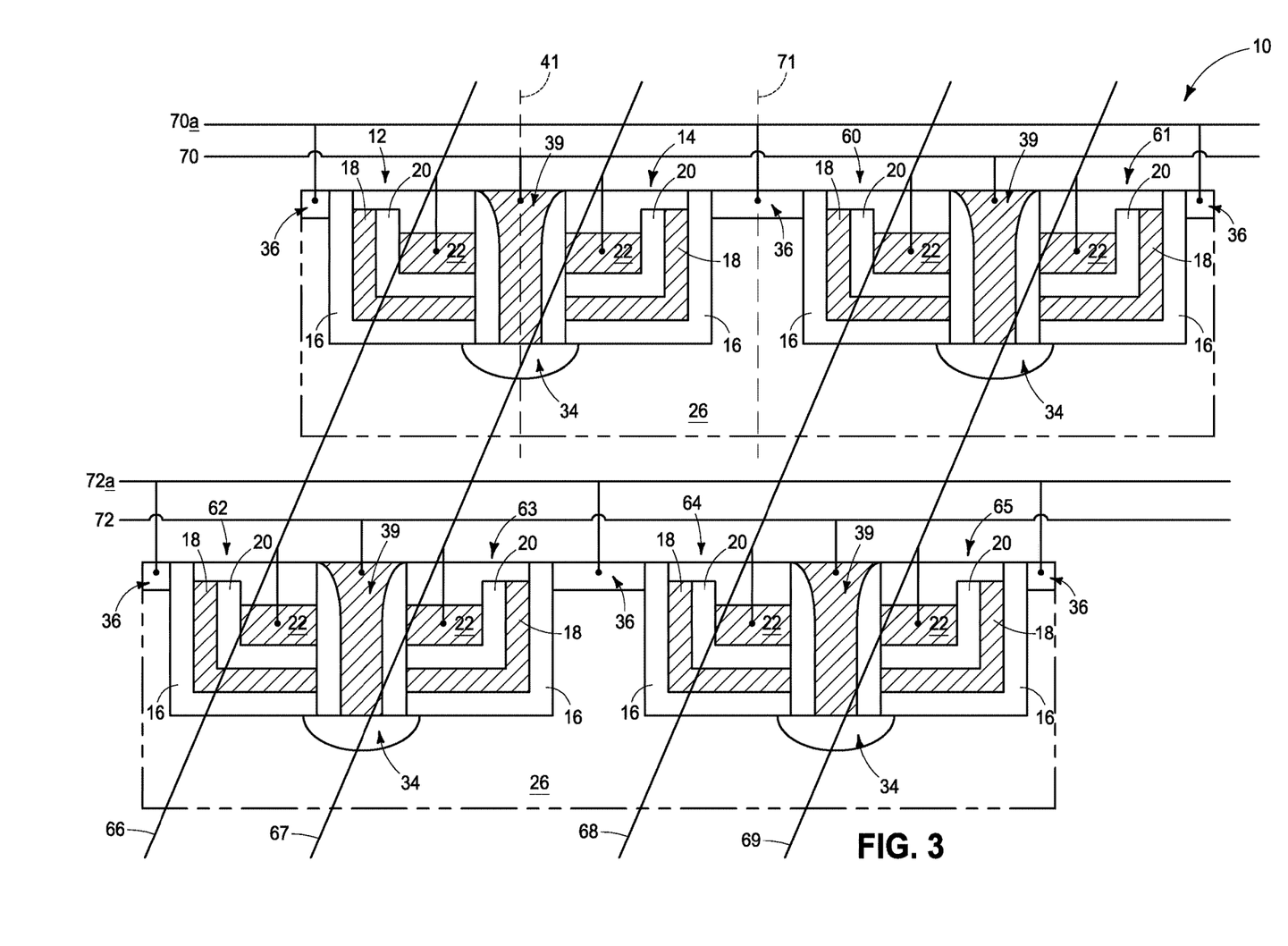
FIG. 3 shows a region of a memory array comprising example ferroelectric transistors. Portions of two columns of the array are shown in diagrammatic cross-section, and portions of digit line and wordline wiring are diagrammatically illustrated extending along and between the two columns.

The ferroelectric transistors 12 and 14 are shown in FIG. 3, together with several more ferroelectric transistors 60-65 of the memory array 10. Rows within the memory array 10 comprise transistor pairs 12/62, 14/63, 60/64 and 61/65. The ferroelectric transistors in a common row as one another have their gates electrically coupled to one another through a wordline, with example wordlines 66-69 being schematically illustrated as being coupled to the gate material 22 within the ferroelectric transistors.

Ferroelectric transistors in a common column as one another are electrically coupled to two digit lines. For instance, digit lines 70 and 70a are shown extending along the column containing ferroelectric transistors 12, 14, 60 and 61; and digit lines 72 and 72a are shown extending along the column comprising ferroelectric transistors 62-65. The two digit lines extending along a column may be referred to as a first digit line and a second digit line, respectively. Accordingly, digit lines 70 and 72 may represent first digit lines, and digit lines 70a and 72a may represent second digit lines. The first digit lines are electrically coupled with first source/drain regions 34, and the second digit lines are electrically coupled with second source/drain regions 36.

In the shown embodiment, all of the first and second source/drain regions 34/36 are shared between adjacent ferroelectric transistors. It was noted above that the adjacent transistors 12 and 14 are substantially mirror images of one another across a plane 41 extending through contact 39. FIG. 3 illustrates such relationship, and also shows that adjacent transistors on either side of a second source/drain region 36 are also substantially mirror images of one another across a plane extending through a center of the second source/drain region. For instance, the adjacent ferroelectric transistors 14 and 60 are substantially mirror images of one another across a plane 71 extending vertically through a center of a second source/drain region 36.

Figure 4:
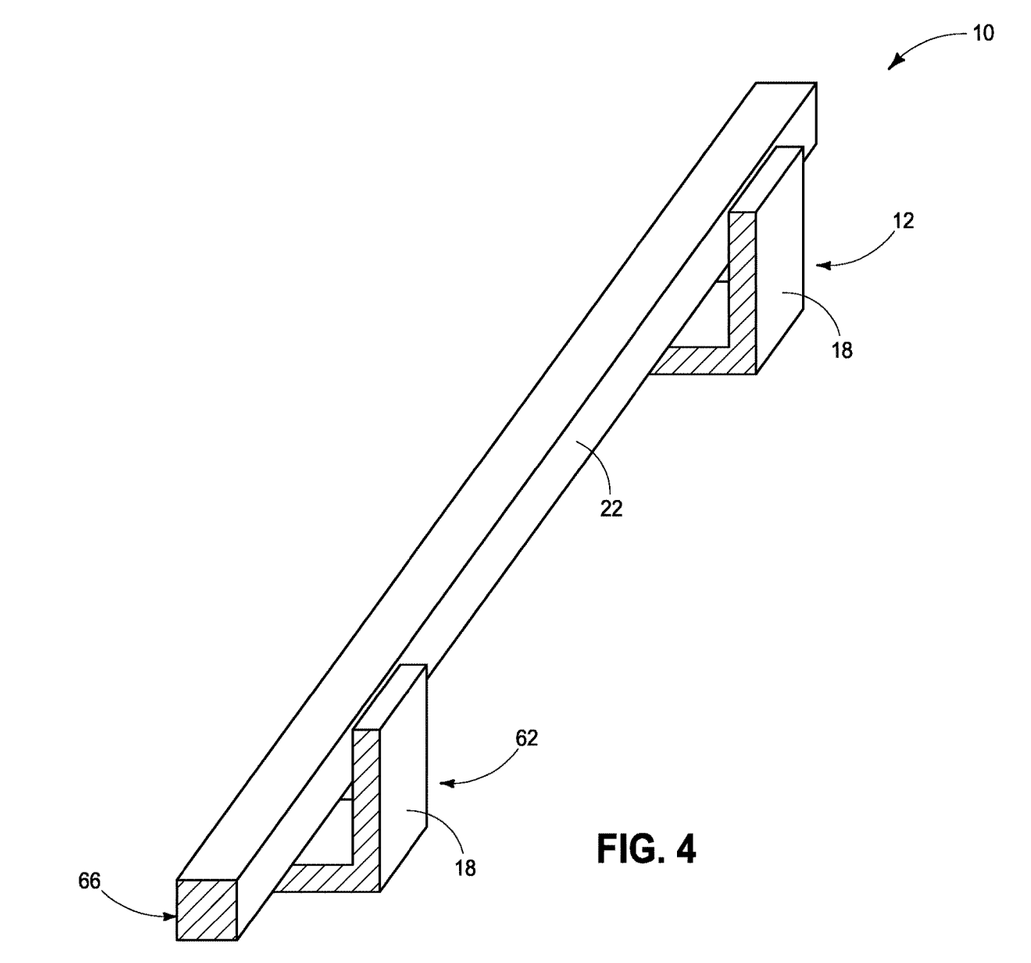
FIG. 4 is a diagrammatic three-dimensional view of a wordline and some components of memory cells along the wordline.

The wordlines 66-69 may comprise the conductive gate material 22, as diagrammatically illustrated in three-dimensional view in FIG. 4. The gate material 22 forms the wordline 66 which extends continuously from ferroelectric transistor 12 to ferroelectric transistor 62. The metal-containing material 18 within the each of the ferroelectric transistors is confined to specific regions along the wordline so that such metal-containing material is discontinuous along the rows of the memory array and does not short adjacent ferroelectric transistors to one another along such rows. The gate dielectric material 16 and ferroelectric material 20 are not shown in FIG. 4 in order to simplify the drawing. The gate dielectric material 16 (FIG. 3) may extend continuously along the wordline in some embodiments, as the insulative gate dielectric will not short adjacent devices to another. Alternatively, the gate dielectric may be patterned similarly to the metal-containing material 18 if such simplifies a fabrication process. The ferroelectric material 20 (FIG. 3) may extend continuously along the wordline provided it does not short adjacent devices to another. Alternatively, the ferroelectric material 20 may be patterned similarly to the metal-containing material 18 if such simplifies a fabrication process and/or if the ferroelectric material may undesirably short adjacent devices to another.

The ferroelectric transistors 12, 14 and 60-65 of FIG. 3 correspond to memory cells of the memory array. The ferroelectric material within the transistors comprises two selectable polarization modes. One of the polarization modes corresponds to a first data state of the memory cells, and the other of the polarization modes corresponds to a second data state of the memory cells. FIGS. 5-8 describe example methodology which may be utilized for reading/writing relative to the memory cells.

Figure 5:
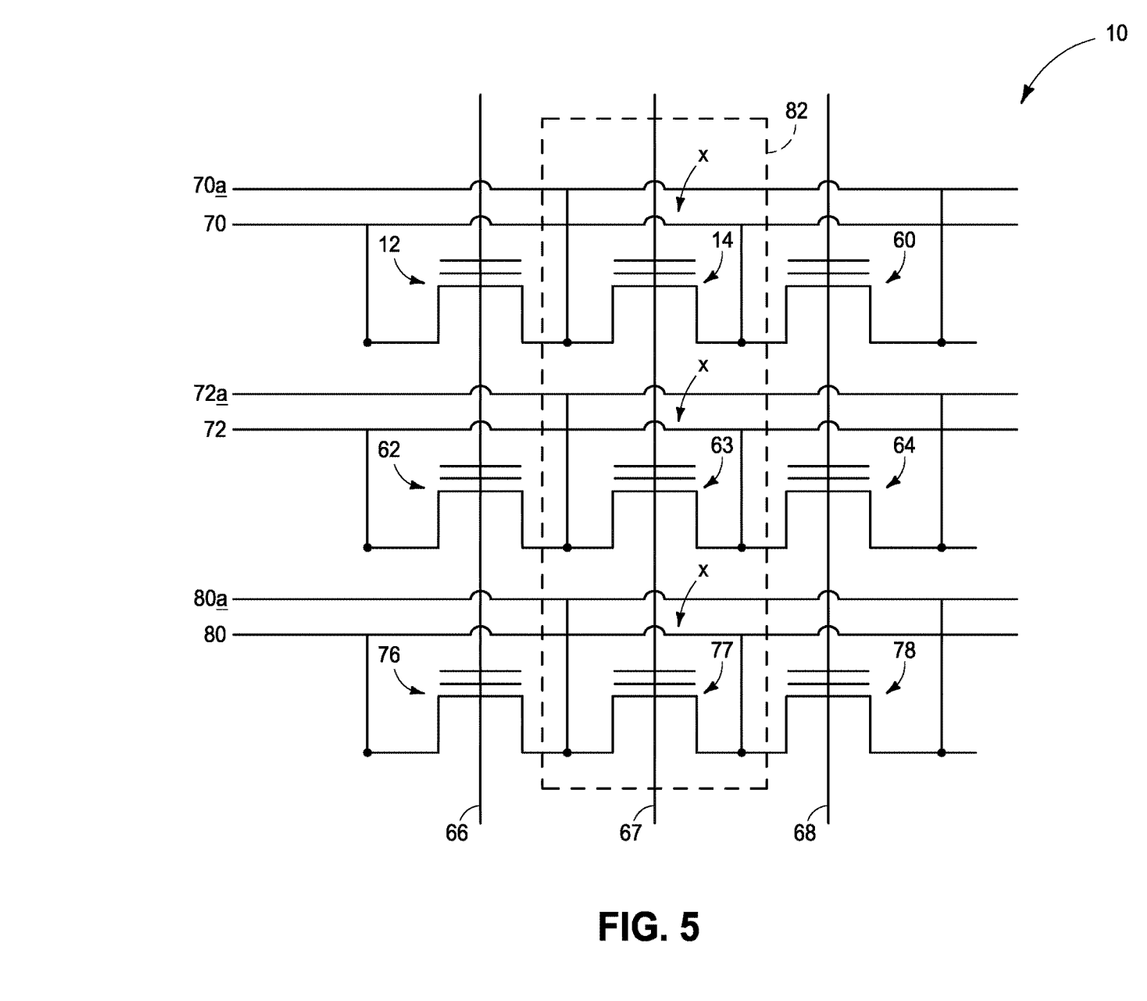
FIG. 5 is a diagrammatic schematic representation of a portion of an example memory array comprising metal-ferroelectric-metal-insulator-semiconductor (MFMIS) transistors.

Referring to FIG. 5, a region of the memory array 10 is schematically illustrated. Such region comprises ferroelectric transistors (i.e., MFMIS transistors) 12, 14, 60, 62-64 and 76-78. The transistors 76-78 may be substantially identical to the transistors 12, 14, 60 and 62-64 described above with reference to FIG. 3.

Wordlines 66-68 extend along rows of the array; and digit line pairs 70/70a, 72/72a, and 80/80a extend along columns of the array. An initial step of a writing operation or a reading operation is to identify a row which will be accessed. Such row may be referred to as an active row. For instance, FIG. 5 diagrammatically illustrates the row of wordline 67 being selected as the active row by showing the row and the memory cells 14, 63 and 77 along such row being within a demarcated region 82. The memory cells 14, 63 and 77 have initial memory states "1" or "0". Such memory states are generically indicated as "x" in FIG. 5 to indicate that the memory states of the individual memory cells may or may not be known at the processing stage of FIG. 5.

Figure 6:
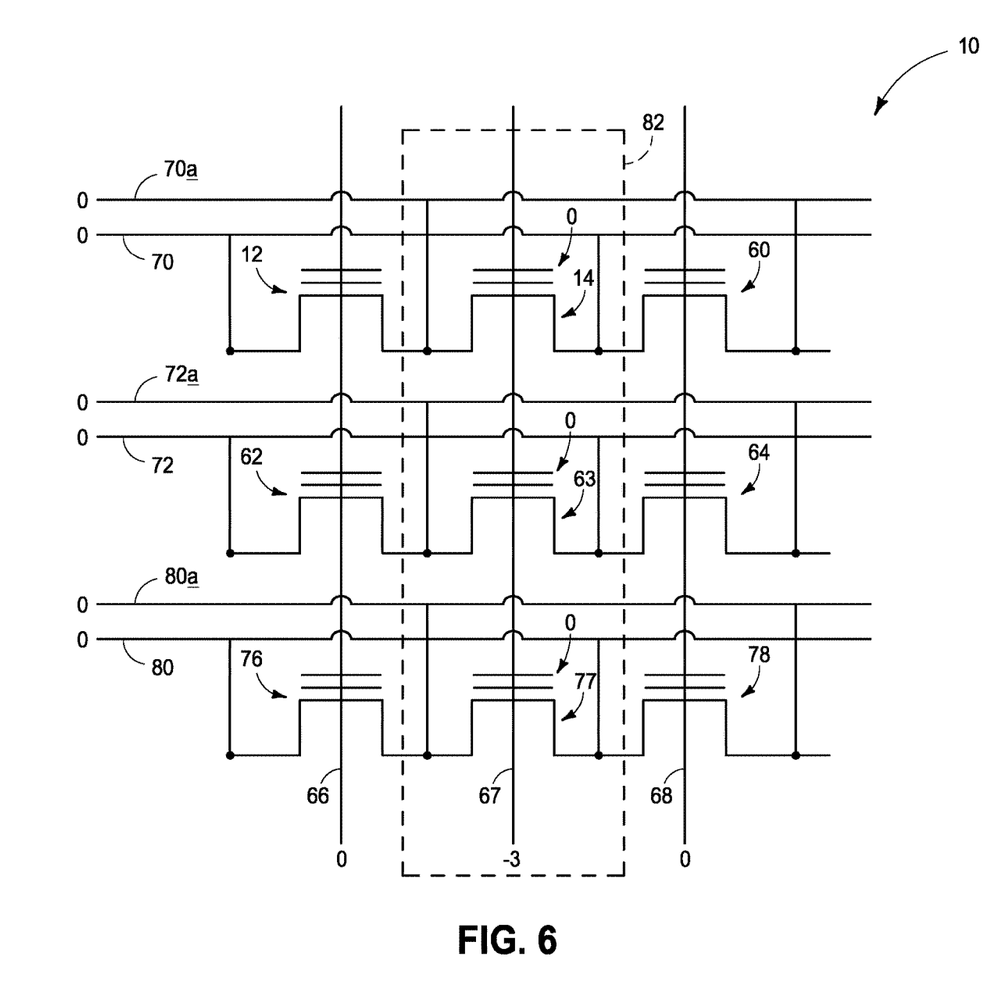
FIGS. 6 and 7 are diagrammatic schematic representations of the portion of the example memory array of FIG. 5 illustrating steps of an example writing operation.
Figure 7:
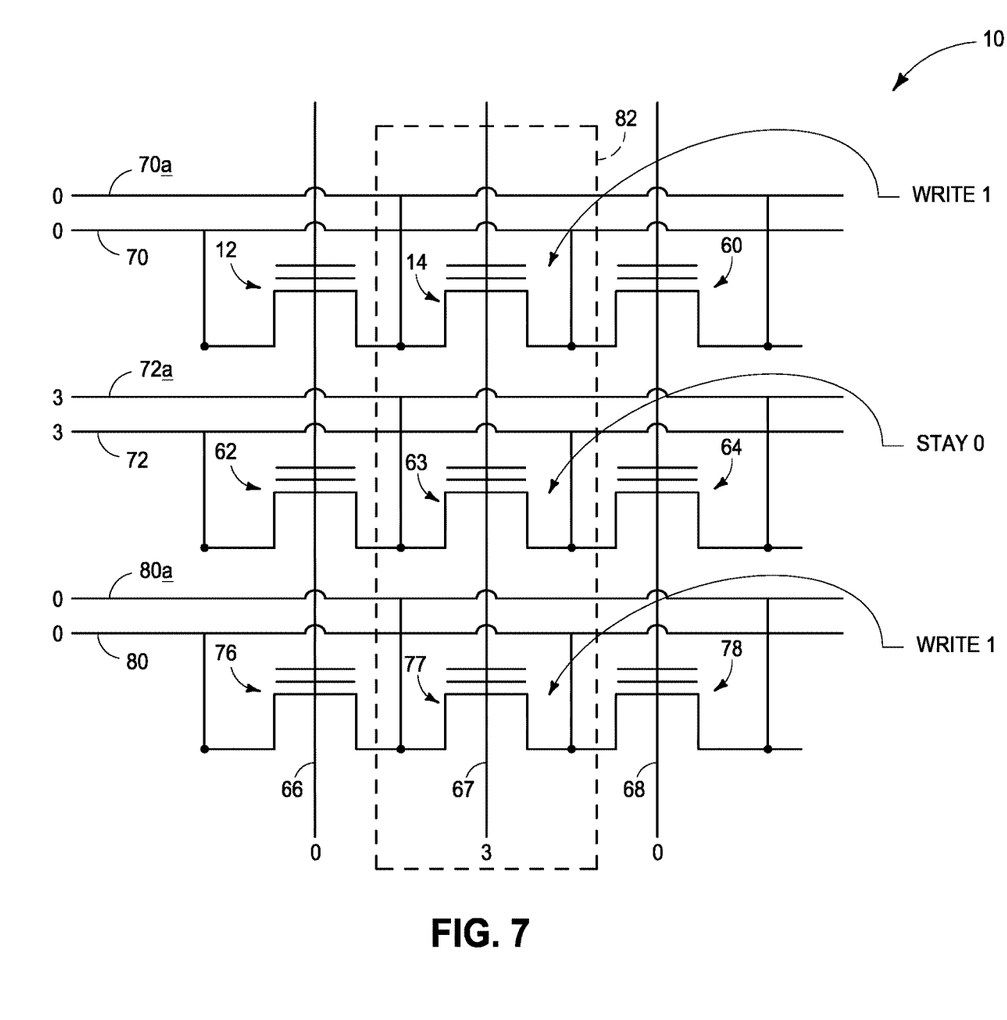

FIGS. 6 and 7 illustrate processing stages of an example Write operation.

Referring to FIG. 6, memory cells along the wordline 67 active row are subjected to a Reset operation. The first and second digit lines 70/70a, 72/72a and 80/80a are held to substantially the same voltage as one another for all of the memory cells within the active row, and simultaneously a first bias voltage is provided along wordline 67 to thereby set all of the memory cells in the active row to a first data state. The first data state is illustrated to be data state "0".

In the illustrated embodiment the first bias voltage is about −3 volts (V), and the wordlines adjacent active wordline 67 are held to a voltage of about 0 V while the bias voltage is applied to the active wordline. Any suitable bias voltage may be used, and the illustrated bias voltage is simply an example bias voltage provided for purposes of illustration. The digit lines are shown held to a voltage of about 0 V during the application of the bias voltage along the wordline 67. Such is an example voltage that may be applied to the digit lines, and in other embodiments other voltages may be applied to the digit lines. The first and second digit lines within the digit line pairs (for instance, 70/70a) are held to a same voltage as one another to within reasonable tolerances. Specifically, the first and second digit lines are held to substantially the same voltage as one another, with the term "substantially the same voltage" meaning that the voltages are the same to within reasonable tolerances so that leakage across the memory cells is minimized or ideally entirely avoided during the Reset operation of FIG. 6.

Referring to FIG. 7, a programming stage following the Reset of FIG. 6 is utilized to set individual memory cells to desired data states. A second bias voltage is applied along the wordline of the active row; with such second bias voltage being about 3 V in the shown embodiment. A first voltage is applied to the first and second digit lines for the memory cells within the active row which are to remain in the first data state; with such first voltage being about 3 V in the shown embodiment and being applied to the digit lines 72/72a. A second voltage is applied to the first and second digit lines for the memory cells which are to be set to the second data state; with such second voltage being about 0 V in the shown embodiment. The illustrated voltages of FIG. 7 are example voltages, and in other embodiments other voltages may be applied. The first and second digit lines within the digit line pairs (for instance, 70/70a) are shown at a same voltage as one another. In some embodiments, the first and second digit lines within the digit line pairs may be held to a same voltage as one another to within reasonable tolerances.

The embodiment of FIGS. 6 and 7 utilizes a second bias voltage on wordline 67 that is of opposite polarity to the first bias voltage and of approximately equal absolute value relative to the first bias voltage. Specifically, the first bias voltage is about −3 V and the second bias voltage is about +3 V. In other embodiments, other relationships of the first and second bias voltages along the active wordline may be utilized.

Figure 8:
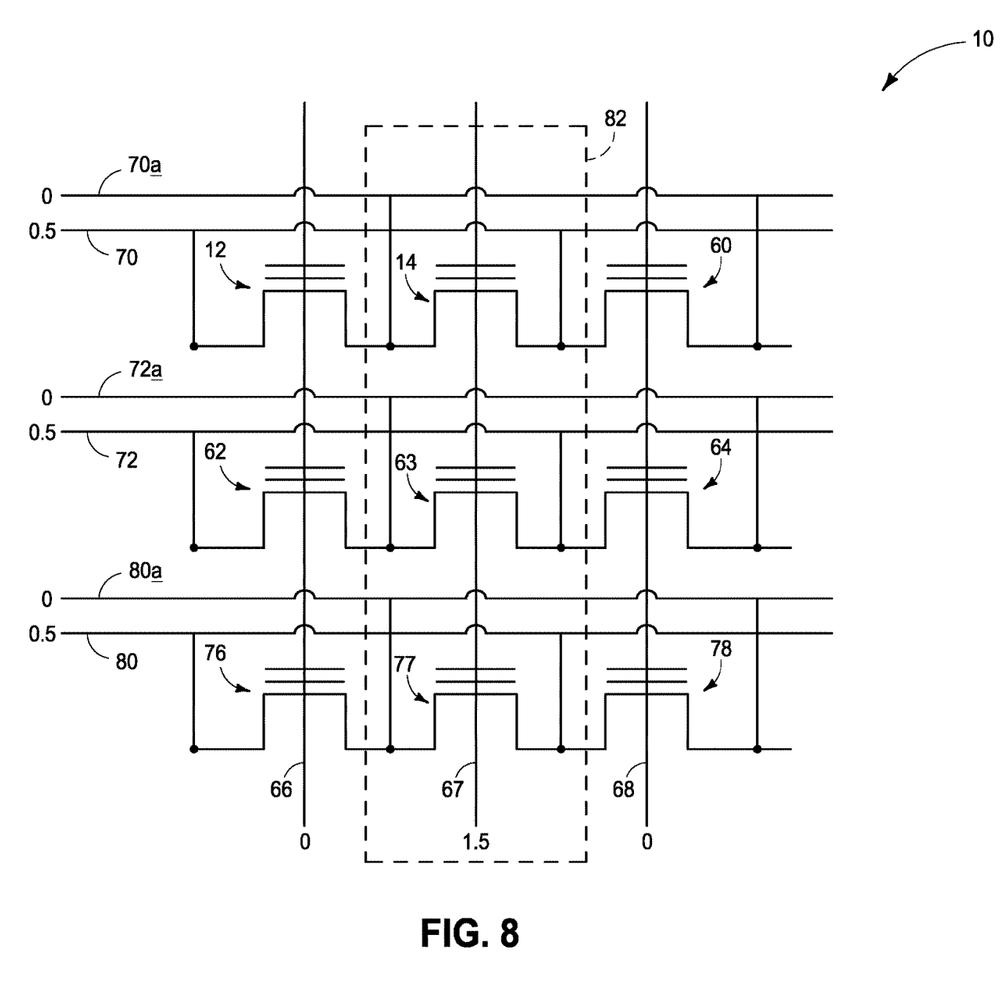
FIG. 8 is a diagrammatic schematic representation of the portion of the example memory array of FIG. 5 illustrating a step of an example reading operation.

FIG. 8 illustrates processing stages of an example Read operation.

The first digit lines within digit line pairs 70/70a, 72/72a and 80/80a are held to different voltages than the second digit lines for all of the memory cells within the active row, and simultaneously a bias voltage is provided along the wordline 67. In the illustrated embodiment the bias voltage is about 1.5V, and the voltage difference between the first and second digit lines is about 0.5V. Any suitable bias voltages may be used, and any suitable voltage differences between the first and second digit lines may be used. The illustrated voltages are simply example voltages provided for purposes of illustration.

The Read and Write operations of FIGS. 5-8 may be utilized with MFMIS transistor arrays comprising ferroelectric transistor configurations of the type shown in FIG. 3, or with arrays comprising any other suitable MFMIS transistor configurations.

The ferroelectric structures and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a ferroelectric transistor. The transistor has gate dielectric material configured as a first container, with the first container having a first inner surface. Metal-containing material is configured as a second container nested within said first container. The second container has a second inner surface with an area less than the first inner surface. Ferroelectric material is configured as a third container nested within the second container. The third container has a third inner surface with an area less than the second inner surface. Gate material is within the third container.

Some embodiments include a memory array having a plurality of ferroelectric transistors in a row/column arrangement. Adjacent ferroelectric transistors along the columns are substantially mirror images of one another and have a shared source/drain region. Each of the ferroelectric transistors has gate dielectric material, metal-containing material, ferroelectric material and a gate material. The gate dielectric material, metal-containing material and ferroelectric material are configured as a first container, second container and third container respectively, which are nested one within the other. The first, second and third containers have first, second and third inner surfaces; with the third inner surface having a smaller area than the second inner surface, and the second inner surface having a smaller area than the first inner surface. The first container has two sides which define about half of a four-sided structure, with the two sides being a first side and a second side. A third side of the four-sided structure extends along edges of the gate material, ferroelectric material, metal-containing material and gate dielectric material. The third side is directly adjacent the second side. A repeating configuration of adjacent ferroelectric transistors along a column being a configuration in which the adjacent ferroelectric transistors face one another along their respective third sides and are spaced from one another by an intervening contact. The shared source/drain region is below the third sides of the adjacent ferroelectric transistors. The contact extends to the shared source/drain region. The shared source/drain region is a first source/drain region and is laterally between a pair of second source/drain regions. One of the second source/drain regions is along the first side of one of the adjacent ferroelectric transistors and the other of the second source/drain regions is along the first side of the other of the adjacent ferroelectric transistors.

Some embodiments include a method of writing to memory cells of a memory array. The memory array is provided to have metal-ferroelectric-metal-insulator-semiconductor (MFMIS) transistors as the memory cells. A first data state of the memory cells corresponds to a first polarization mode of ferroelectric material within the MFMIS transistors and a second data state of the memory cells corresponds to a second polarization mode of the ferroelectric material within the MFMIS transistors. The individual MFMIS transistors comprise a gate and a pair of source/drain regions. The memory array comprises rows and columns of the MFMIS transistors. MFMIS transistors in a common row as one another have their gates electrically coupled to one another through a wordline. MFMIS transistors in a common column as one another share a pair of digit lines; a first of the digit lines is connected to one source/drain region of each of the MFMIS transistors in said common column, and a second of the digit lines is connected to the other source/drain region of each of the MFMIS transistors in said common column. An active row is identified as having one or more memory cells for which a data state is to be changed. The first and second digit lines are held to a substantially same voltage for all memory cells within the active row while a first bias voltage is simultaneously provided along the wordline of the active row to thereby set all of the memory cells in the active row to the first data state. After all of the memory cells in the active row are set to the first data state, the following occur simultaneously: a first voltage is applied to the first and second digit lines for one or more of the memory cells within the active row which are to remain in the first data state, a second voltage is applied to the first and second digit lines for one or more of the memory cells within the active row that are to be set to the second data state, and a second bias voltage is applied along the wordline of the active row. The second bias voltage is about the same as the first voltage and is higher than the second voltage.

Some embodiments include a method of reading memory cells of a memory array. The memory array is provided to have metal-ferroelectric-metal-insulator-semiconductor (MFMIS) transistors as the memory cells. A first data state of the memory cells corresponds to a first polarization mode of ferroelectric material within the MFMIS transistors and a second data state of the memory cells corresponds to a second polarization mode of the ferroelectric material within the MFMIS transistors. The individual MFMIS transistors comprise a gate and a pair of source/drain regions. The memory array comprises rows and columns of the MFMIS transistors. MFMIS transistors in a common row as one another have all of their gates electrically coupled to one another through a wordline. MFMIS transistors in a common column as one another share a pair of digit lines. A first of the digit lines is connected to one source/drain region of each of the MFMIS transistors in said common column, and a second of the digit lines is connected to the other source/drain region of each of the MFMIS transistors in said common column. An active row is identified as comprising memory cells which are to be read. A voltage difference between the first and second digit lines is provided for all of the memory cells within the active row while simultaneously providing a bias voltage along the wordline of the active row.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A ferroelectric transistor, comprising:
    gate dielectric material configured as a first container, the first container having a first opening extending into the dielectric material and being defined by a first inner bottom surface and a first inner sidewall surface extending orthogonally relative to the first inner bottom surface;
    metal-containing material configured as a second container nested within said first opening, the second container having a second opening extending into the metal containing material and being defined by a second inner bottom surface with an area less than the first inner surface and having a second inner sidewall surface extending orthogonally relative to the second inner bottom surface;
    ferroelectric material configured as a third container nested within the second opening, the third container having a third inner bottom surface with an area less than the second inner surface and having a third inner sidewall surface extending orthogonally relative to the third inner bottom surface;
    gate material within the third container; and
    a common sidewall surface that extends orthogonally relative to the first, second and third inner bottom surfaces, each of the gate dielectric material, the metal-containing material, the ferroelectric material and the gate material being in direct physical contact with an insulative sidewall spacer material along the common sidewall surface.

2. The ferroelectric transistor of claim 1 wherein the first, second and third containers are elbow-shaped.

3. The ferroelectric transistor of claim 1 wherein an edge of the second container is inset relative to an edge of the first container.

4. The ferroelectric transistor of claim 3 wherein an edge of the third container is inset relative to an edge of the first container by about a same amount as the edge of the second container is inset relative to the edge of the first container.

5. The ferroelectric transistor of claim 3 wherein an edge of the third container is inset relative to an edge of the first container by a greater amount than the edge of the second container is inset relative to the edge of the first container.

6. The ferroelectric transistor of claim 3 wherein an edge of the third container is inset relative to an edge of the first container by about a lesser amount than the edge of the second container is inset relative to the edge of the first container.

7. The ferroelectric transistor of claim 1 wherein:
    the first container has two sides defining about half of a four-sided structure, said two sides being a first side and a second side;
    a third side of the four-sided structure extends along edges of the gate material, ferroelectric material, metal-containing material and gate dielectric material; the third side being directly adjacent the second side;
    an insulative spacer extends entirely along said third side;
    a first source/drain region is along a portion of the second side and extends to under the insulative spacer;
    a second source/drain region is along a portion of the first side; and
    a channel region extends along the first and second sides and between the first and second source/drain regions.

8. A memory array, comprising:
    a plurality of ferroelectric transistors in a row/column arrangement; adjacent ferroelectric transistors along the columns being substantially mirror images of one another and having a shared source/drain region; each of the ferroelectric transistors comprising:
        gate dielectric material configured as a first container having an opening extending into the gate dielectric material defined by a first inner base surface and first sidewall surface, the first container having two sides which define about half of a four-sided structure; the two sides being a first side and a second side;
        metal-containing material configured as a second container nested within said first opening, the second container having a second inner base and sidewall surfaces, the second inner base surface having an area less than the first inner base surface;
        ferroelectric material configured as a third container nested within the second container, the third container having a third inner base surface with an area less than the second inner base surface;
        gate material within the third container; and
        a third side of the four-sided structure extending orthogonally relative to the first, second and third inner base surfaces, the third side comprising edges of the gate material, ferroelectric material, metal-containing material and gate dielectric material, the third side being against an insulative sidewall spacer material such that each of the gate dielectric material, the metal containing material, the ferroelectric material and the gate material have surfaces in direct physical contact with the insulative sidewall spacer material; the third side being directly adjacent the second side; and
    a repeating configuration of adjacent ferroelectric transistors along a column being a configuration in which the adjacent ferroelectric transistors face one another along their respective third sides and are spaced from one another by an intervening contact; the shared source/drain region being below the third sides of the adjacent ferroelectric transistors; said intervening contact extending to the shared source/drain region; the shared source/drain region being a first source/drain region and being laterally between a pair of second source/drain regions; one of the second source/drain regions being along the first side of one of the adjacent ferroelectric transistors and the other of the second source/drain regions being along the first side of the other of the adjacent ferroelectric transistors.

9. The memory array of claim 8 wherein each of the ferroelectric transistors has upper surfaces of the second and third containers inset relative to an upper surface of the first container.

10. The memory array of claim 8, wherein:
ferroelectric transistors in a common row as one another have all of their gates electrically coupled to one another through a wordline;
ferroelectric transistors in a common column as one another are electrically coupled to two digit lines; a first of said two digit lines being electrically coupled with first source/drain regions, and a second of said two digit lines being electrically coupled with second source/drain regions; and
the ferroelectric transistors are memory cells, with a first data state of the memory cells corresponding to a first polarization mode of the ferroelectric material within the ferroelectric transistors and a second data state of the memory cells corresponding to a second polarization mode of the ferroelectric material within the ferroelectric transistors.

11. The memory array of claim 10 wherein the ferroelectric material is continuous along the rows of the array.

12. The memory array of claim 10 wherein the ferroelectric material is not continuous along the rows of the array.

13. The memory array of claim 10 wherein the gate dielectric material is continuous along the rows of the array.

14. The memory array of claim 10 wherein the gate dielectric material is not continuous along the rows of the array.

15. A method of writing to memory cells of memory array wherein the memory array comprises:
a plurality of ferroelectric transistors in a row/column arrangement; adjacent ferroelectric transistors along the columns being substantially mirror images of one another and having a shared source/drain region; each of the ferroelectric transistors comprising:
gate dielectric material configured as a first container having an opening extending into the gate dielectric material defined by a first inner base surface and first sidewall surface, the first container having two sides which define about half of a four-sided structure; the two sides being a first side and a second side;
metal-containing material configured as a second container nested within said first opening, the second container having a second inner base and sidewall surfaces, the second inner base surface having an area less than the first inner base surface;
ferroelectric material configured as a third container nested within the second container, the third container having a third inner base surface with an area less than the second inner base surface;
gate material within the third container; and
a third side of the four-sided structure extending orthogonally relative to the first, second and third inner base surfaces, the third side comprising edges of the gate material, ferroelectric material, metal-containing material and gate dielectric material, the third side being against an insulative sidewall spacer material such that each of the gate dielectric material, the metal containing material, the ferroelectric material and the gate material have surfaces in direct physical contact with the insulative sidewall spacer material; the third side being directly adjacent the second side; and
a repeating configuration of adjacent ferroelectric transistors along a column being a configuration in which the adjacent ferroelectric transistors face one another along their respective third sides and are spaced from one another by an intervening contact; the shared source/drain region being below the third sides of the adjacent ferroelectric transistors; said intervening contact extending to the shared source/drain region; the shared source/drain region being a first source/drain region and being laterally between a pair of second source/drain regions; one of the second source/drain regions being along the first side of one of the adjacent ferroelectric transistors and the other of the second source/drain regions being along the first side of the other of the adjacent ferroelectric transistors;
wherein ferroelectric transistors in a common row as one another have all of their gates electrically coupled to one another through a wordline;
wherein ferroelectric transistors in a common column as one another are electrically coupled to two digit lines; a first of said two digit lines being electrically coupled with first source/drain regions, and a second of said two digit lines being electrically coupled with second source/drain regions; and
wherein the ferroelectric transistors are memory cells, with a first data state of the memory cells corresponding to a first polarization mode of the ferroelectric material within the ferroelectric transistors and a second data state of the memory cells corresponding to a second polarization mode of the ferroelectric material within the ferroelectric transistors;
the method comprising:
identifying an active row comprising one or more memory cells for which a data state is to be changed;
holding the first and second digit lines to a substantially same voltage for all of the memory cells within the active row and simultaneously applying a first bias voltage along the wordline of the active row to thereby set all of the memory cells in the active row to the first data state; and
after all of the memory cells in the active row are set to the first data state, simultaneously:
applying a first voltage to the first and second digit lines for one or more of the memory cells within the active row which are to remain in the first data state;
applying a second voltage to the first and second digit lines for one or more of the memory cells within the active row that are to be set to the second data state; and
applying a second bias voltage along the wordline of the active row; the second bias voltage being about the same as the first voltage and being higher than the second voltage.

16. The method of claim 15 wherein the second bias voltage is of opposite polarity relative to the first bias voltage.

17. The method of claim 15 wherein the second bias voltage is of opposite polarity and of approximately equal absolute value relative to the first bias voltage.

18. A method of reading memory cells of a memory array wherein the memory array comprises:
a plurality of ferroelectric transistors in a row/column arrangement: adjacent ferroelectric transistors along the columns being substantially mirror images of one another and having a shared source/drain region; each of the ferroelectric transistors comprising:
gate dielectric material configured as a first container having an opening extending into the gate dielectric material defined by a first inner base surface and first sidewall surface, the first container having two sides which define about half of a four-sided structure; the two sides being a first side and a second side;

metal-containing material configured as a second container nested within said first opening, the second container having a second inner base and sidewall surfaces, the second inner base surface having an area less than the first inner base surface;

ferroelectric material configured as a third container nested within the second container, the third container having a third inner base surface with an area less than the second inner base surface;

gate material within the third container; and a third side of the four-sided structure extending orthogonally relative to the first, second and third inner base surfaces, the third side comprising edges of the gate material, ferroelectric material, metal-containing material and gate dielectric material, the third side being against an insulative sidewall spacer material such that each of the gate dielectric material, the metal containing material, the ferroelectric material and the gate material have surfaces in direct physical contact with the insulative sidewall spacer material; the third side being directly adjacent the second side; and a repeating configuration of adjacent ferroelectric transistors along a column being a configuration in which the adjacent ferroelectric transistors face one another along their respective third sides and are spaced from one another by an intervening contact; the shared source/drain region being below the third sides of the adjacent ferroelectric transistors; said intervening contact extending to the shared source/drain region; the shared source/drain region being a first source/drain region and being laterally between a pair of second source/drain regions; one of the second source/drain regions being along the first side of one of the adjacent ferroelectric transistors and the other of the second source/drain regions being along the first side of the other of the adjacent ferroelectric transistors;

wherein ferroelectric transistors in a common row as one another have all of their gates electrically coupled to one another through a wordline;

wherein ferroelectric transistors in a common column as one another are electrically coupled to two digit lines; a first of said two digit lines being electrically coupled with first source/drain regions, and a second of said two digit lines being electrically coupled with second source/drain regions; and wherein the ferroelectric transistors are memory cells, with a first data state of the memory cells corresponding to a first polarization mode of the ferroelectric material within the ferroelectric transistors and a second data state of the memory cells corresponding to a second polarization mode of the ferroelectric material within the ferroelectric transistors:

the method comprising:

identifying an active row comprising memory cells which are to be read; and providing a voltage difference between the first and second digit lines for all of the memory cells within the active row while simultaneously providing a bias voltage along the wordline of the active row.

* * * * *